United States Patent
You et al.

(10) Patent No.: US 10,170,366 B2
(45) Date of Patent: Jan. 1, 2019

(54) SEMICONDUCTOR DEVICE HAVING DUMMY GATES AND METHOD OF FABRICATING THE SAME

(71) Applicant: SAMSUNG ELECTRONICS CO., LTD., Suwon-si, Gyeonggi-do (KR)

(72) Inventors: Jung-Gun You, Ansan-si (KR); Jeong-Hyo Lee, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 5 days.

(21) Appl. No.: 15/436,343

(22) Filed: Feb. 17, 2017

(65) Prior Publication Data

US 2017/0170071 A1 Jun. 15, 2017

Related U.S. Application Data

(63) Continuation of application No. 14/824,896, filed on Aug. 12, 2015.

(30) Foreign Application Priority Data

Dec. 3, 2014 (KR) .................. 10-2014-0172248

(51) Int. Cl.
*H01L 27/088* (2006.01)
*H01L 21/8234* (2006.01)
*H01L 29/06* (2006.01)
*H01L 29/49* (2006.01)
*H01L 27/02* (2006.01)

(52) U.S. Cl.
CPC ........... *H01L 21/823431* (2013.01); *H01L 21/823418* (2013.01); *H01L 21/823437* (2013.01); *H01L 21/823481* (2013.01); *H01L 27/0207* (2013.01); *H01L 27/0886* (2013.01); *H01L 29/0649* (2013.01); *H01L 29/495* (2013.01); *H01L 29/4966* (2013.01)

(58) Field of Classification Search
CPC ........... H01L 27/0886; H01L 29/66545; H01L 21/823418; H01L 27/0207
See application file for complete search history.

(56) References Cited

U.S. PATENT DOCUMENTS

| 8,324,668 B2 | 12/2012 | Huang et al. |
| 8,610,236 B2 | 12/2013 | Chen et al. |
| 8,648,422 B2 | 2/2014 | Sakuma |
| 8,766,256 B2 | 7/2014 | Chen et al. |

(Continued)

*Primary Examiner* — Stephen Bradley
(74) *Attorney, Agent, or Firm* — F. Chau & Associates, LLC

(57) ABSTRACT

A semiconductor device is provided as follows. Active fins protrude from a substrate, extending in a first direction. A first device isolation layer is disposed at a first side of the active fins. A second device isolation layer is disposed at a second side of the active fins. A top surface of the second device isolation layer is higher than a top surface of the first device isolation layer and the second side is opposite to the first side. A normal gate extends across the active fins in a second direction crossing the first direction. A first dummy gate extends across the active fins and the first device isolation layer in the second direction. A second dummy gate extends across the second device isolation layer in the second direction.

14 Claims, 25 Drawing Sheets

(56) References Cited

U.S. PATENT DOCUMENTS

| | | | |
|---|---|---|---|
| 8,878,309 B1* | 11/2014 | Hong | H01L 27/0886 |
| | | | 257/330 |
| 9,373,535 B2* | 6/2016 | Shen | H01L 21/76232 |
| 2010/0052065 A1 | 3/2010 | Diaz et al. | |
| 2012/0025315 A1 | 2/2012 | Kronholz et al. | |
| 2013/0187237 A1* | 7/2013 | Yu | H01L 21/823807 |
| | | | 257/369 |
| 2013/0292777 A1* | 11/2013 | Liaw | G11C 11/412 |
| | | | 257/369 |
| 2014/0154854 A1 | 6/2014 | Wei et al. | |
| 2015/0115363 A1* | 4/2015 | Chang | H01L 21/823431 |
| | | | 257/347 |
| 2015/0340466 A1* | 11/2015 | Fukuda | H01L 29/7848 |
| | | | 257/190 |
| 2016/0099181 A1* | 4/2016 | Tung | H01L 21/823821 |
| | | | 257/369 |
| 2016/0111524 A1* | 4/2016 | Ha | H01L 29/66795 |
| | | | 438/283 |
| 2016/0155739 A1* | 6/2016 | Ting | H01L 29/0653 |
| | | | 257/401 |
| 2016/0163699 A1 | 6/2016 | You et al. | |

\* cited by examiner

1

1200

1300

1400

SEMICONDUCTOR DEVICE HAVING DUMMY GATES AND METHOD OF FABRICATING THE SAME

CROSS-REFERENCE TO RELATED APPLICATION

This is a continuation of U.S. application Ser. No. 14/824,896 filed on Aug. 12, 2015, which claims priority under 35 U.S.C. § 119 to Korean Patent Application No. 10-2014-0172248, filed on Dec. 3, 2014 in the Korean Intellectual Property Office, and the disclosure of which is incorporated by reference herein in its entirety.

TECHNICAL FIELD

The present inventive concept relates to a semiconductor device and a method of fabricating the same.

DISCUSSION OF RELATED ART

As semiconductor devices scale down in size, a three-dimensional channel structure is used to increase current controlling capability and reduce a short channel effect (SCE) of the semiconductor devices.

SUMMARY

According to an exemplary embodiment of the present inventive concept, a semiconductor device is provided as follows. Active fins protrude from a substrate, extending in a first direction. A first device isolation layer is disposed at a first side of the active fins. A second device isolation layer is disposed at a second side of the active fins. A top surface of the second device isolation layer is higher than a top surface of the first device isolation layer and the second side is opposite to the first side. A normal gate extends across the active fins in a second direction crossing the first direction. A first dummy gate extends across the active fins and the first device isolation layer in the second direction. A second dummy gate extends across the second device isolation layer in the second direction.

According to an exemplary embodiment of the present inventive concept, a semiconductor device is provided as follows. A first active fin protrudes from a substrate, extending in a first direction. A second active fin protrudes from the substrate, extending in the first direction. The second active fin is spaced apart from the first active fin in a second direction crossing the first direction. A first device isolation layer is disposed at a first side of the first active fin and at a first side of the second active fin. A second device isolation layer is disposed at a second side of the first active fin and at a second side of the second active fin. The second side of the first active fin is opposite to the first side of the first active fin. A first dummy gate extends in the second direction, overlapping the first active fin, the second active fin and the first device isolation layer. A second dummy gate extends in the second direction, overlapping the first active fin and the second device isolation layer.

According to an exemplary embodiment of the present inventive concept, a semiconductor device is provided as follows. An active fin protrudes from a substrate, extending in a first direction. A first device isolation layer is disposed at a first side of the active fin. A second device isolation layer is disposed at a second side of the active fin. The second device isolation layer has a top surface higher than a top surface of the first device isolation layer. A normal gate extends across the active fin in a second direction crossing the first direction. A first dummy gat extends across the first device isolation layer in the second direction. A second dummy gate extends across the second device isolation layer and the active fin in the second direction.

According to an exemplary embodiment of the present inventive concept, a semiconductor device is provided as follows. Active fins protrude from a substrate, extending in a first direction. A device isolation layer is disposed at one side of the active fins and extended in a second direction crossing the first direction. A normal gate extends across the active fins in a second direction crossing the first direction. A first dummy gat extends across the device isolation layer in the second direction. A second dummy gate extends across the active fins and the device isolation layer in the second direction.

According to an exemplary embodiment of the present inventive concept, a method of fabricating a semiconductor device is provided as follows. Active fins are formed. The active fins protrude from a substrate, extending in a first direction. A first device isolation layer, extending at a first side of the active fins, is formed. A second device isolation layer, extending at a second side of the active fins opposite to the first side, is formed. The second device isolation layer has a top surface higher than a top surface of the first device isolation layer. A first dummy gate, extending across the active fins and the first device isolation layer in a second direction crossing the first direction, is formed. A second dummy gate, extending across the active fins in the second direction, is formed. A third dummy gate, extending across the second device isolation layer in the second direction, is formed. The second dummy gate is interposed between the first dummy gate and the third dummy gate. The second dummy gate is replaced with a metal gate.

According to an exemplary embodiment of the present inventive concept, a semiconductor device is provided as follows. An active fin protrudes from a substrate, extending in a first direction. A first device isolation layer is adjacent to a first side of the active fin. A second device isolation layer is adjacent to a second side of the active fin opposite to the first side. A first dummy gate line is disposed on the active fin and the first device isolation layer. A first boundary between the active fin and the first device isolation layer is underneath the first dummy gate. A second dummy gate is disposed on the active fin and the second device isolation layer. A second boundary between the active fin and the second device isolation is underneath the second dummy gate. Normal gates are disposed on the active fin and between the first dummy gate and the second dummy gate.

BRIEF DESCRIPTION OF THE DRAWINGS

These and other features of the inventive concept will become more apparent by describing in detail exemplary embodiments thereof with reference to the accompanying drawings of which.

Figure 1:
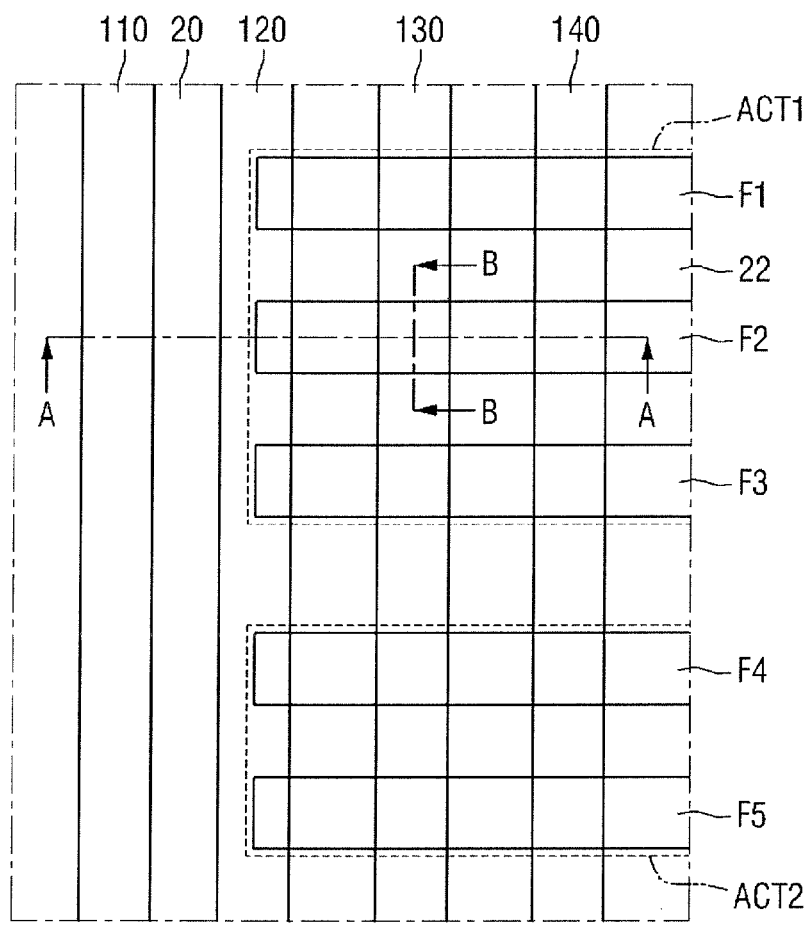
FIG. 1 is a layout view of a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF THE EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a semiconductor device according to an embodiment of the present inventive concept will be described with reference to FIGS. 1 to 3.

FIG. 1 is a layout view of a semiconductor device according to an exemplary embodiment of the present inventive concept. FIG. 2 is a perspective view of a normal gate shown in FIG. 1. FIG. 3A is a cross-sectional view taken along line A-A of FIG. 1, and FIG. 3B is a cross-sectional view taken along line B-B of FIG. 1.

Figure 2:
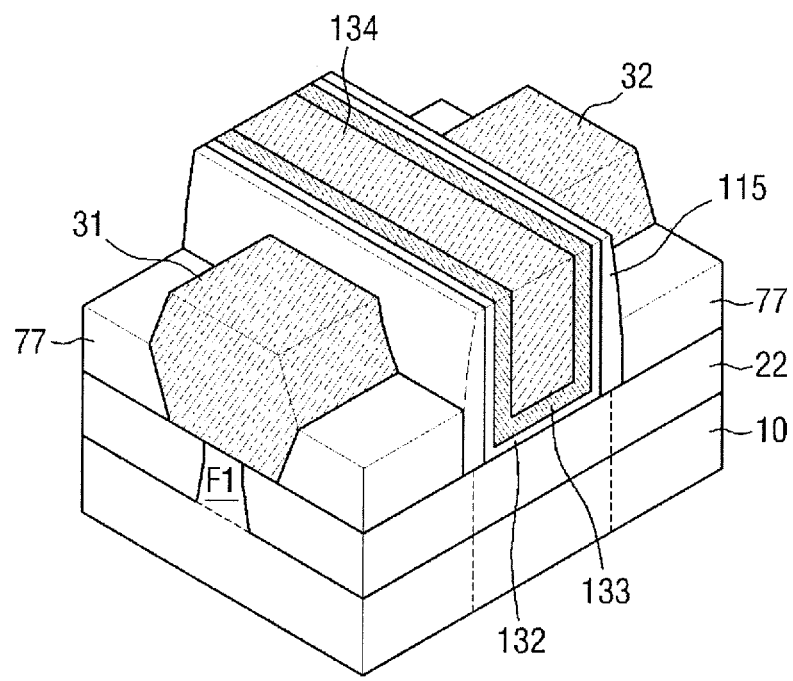
FIG. 2 is a perspective view of a normal gate shown in FIG. 1.
Figure 3A:
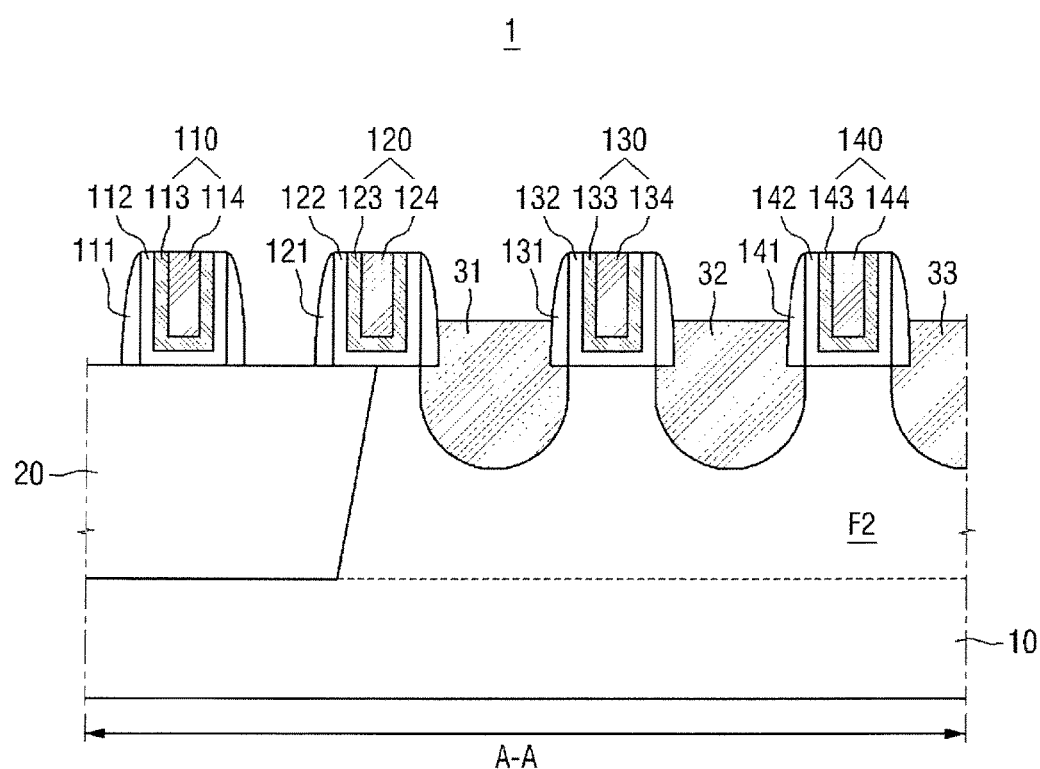
FIG. 3A is a cross-sectional view taken along line A-A of FIG. 1.
Figure 3B:
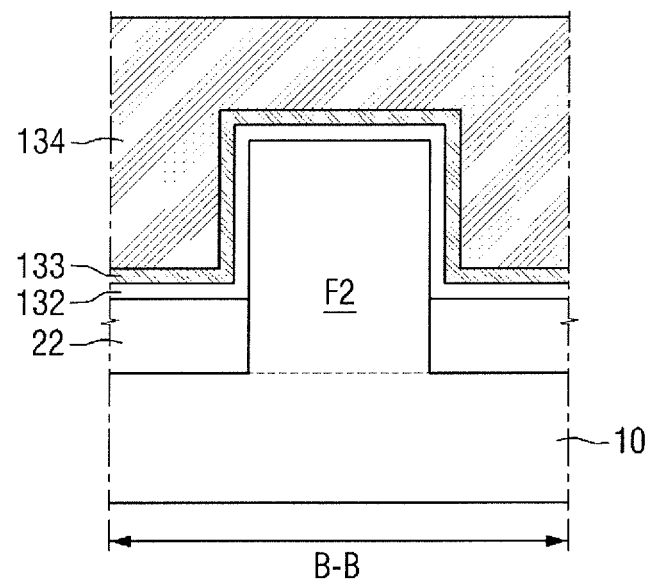
FIG. 3B is a cross-sectional view taken along line B-B of FIG. 1.

Referring to FIGS. 1 to 3, the semiconductor device 1 includes active fins F1 to F5, dummy gates 110 and 120, normal gates 130 and 140, and a device isolation layer 20.

The active fins F1 to F5 protrude from a substrate 10, extending in a first direction X. For the convenience of description, five active fins will be described. However, the present inventive concept is not limited thereto, and the number of the active fins may change according to an exemplary embodiment.

The substrate 10 may include a semiconductor material. The semiconductor material may include Si, Ge, SiGe, GaP, GaAs, SiC, SiGeC, InAs or InP, but the present inventive concept is not limited thereto. For example, the substrate 10 may include an insulating substrate. In this case, the substrate 10 may be, for example, a silicon on insulator (SOI) substrate. If the substrate 10 is an SOI substrate, a response speed of the semiconductor device 1 may increase.

Each of the active fins F1 to F5 may have long sides and short sides. As shown in FIG. 1, the active fins F1 to F5 may be arranged on the substrate 10 to be spaced apart from each other in, for example, a second direction Y.

In FIG. 1, the long-side direction of the active fins F1 to F5 is the first direction X, and the short-side direction of the active fins F1 to F5 is the second direction Y, but the present inventive concept is not limited thereto. For example, the long-side direction of the active fins F1 to F5 may be the second direction Y and the short-side direction of the active fins F1 to F5 may be the first direction X.

In an exemplary embodiment, the active fins F1 to F5 may be part of the substrate 10. In this case, the active fins F1 to F5 may be formed by etching the substrate 10. Alternatively, the active fins F1 to F5 may be epitaxial layers grown from the substrate 10.

The active fins F1 to F5 may be formed of a semiconductor material including, for example, Si or SiGe.

In an exemplary embodiment, the active fins F1 to F5 and the substrate 10 may be formed of the same material. For example, if the substrate 10 is formed of, for example Si, the active fins F1 to F5 may be formed of Si. The present inventive concept is not limited thereto. For example, the substrate 10 and the active fins F1 to F5 may include different materials. In this case, if the substrate 10 includes, for example Si, the active fins F1 to F5 may include a different material from Si. In this case, the active fins F1 to F5 may be formed on the substrate 10 through, for example, an epitaxial growth process.

In this embodiment, the active fins F1 to F3 are formed in a first active region ACT1 and the active fins F4 and F5 are formed in a second active region ACT2. The present inventive concept is not limited thereto, and the number of active fins in each active region may change according to an exemplary embodiment.

A field insulation layer 22 is formed on the substrate 10, covering lower portions of sidewalls of the active fins F1 to F5 and exposing upper portions of the active fins F1 to F5. The field insulation layer 22 may be formed of an oxide layer, for example.

The device isolation layer 20 is formed at one side of the active fins F1 to F5. For example, referring to FIG. 3A, the device isolation layer 20 is formed in the left side of the active fin F2. The device isolation layer 20 and the field insulation layer 22 may be merged to each other at regions where the long and short sides of the active fins F1 to F5 intersect each other.

A bottom surface of the device isolation layer 20 is positioned on substantially the same plane with a top surface of the substrate 10. Alternatively, a top surface of the device isolation layer 20 may be positioned on substantially the same plane with top surfaces of the active fins F1 to F5.

The device isolation layer 20 may be formed of an insulation layer. For example, the device isolation layer 20 may include an oxide layer, an oxynitride layer or a nitride layer, but the present inventive concept is not limited thereto.

The device isolation layer 20 may serve to electrically insulate the active fins F1 to F5 from each other.

The normal gates 130 and 140 are formed on the active fins F1 to F5, extending in the second direction Y crossing the first direction X along which the active fins F1 to F5 are extended.

The present inventive concept is not limited thereto. For example, the normal gates 130 and 140 may extend in acute angles or obtuse angles with respect to the first direction along which the active fins F1 to F5 are extended.

As shown, the normal gates 130 and 140 are spaced apart from each other in the first direction X.

Each of the normal gates 130 and 140 may include a metal gate. The normal gates 130 and 140 may include first metal layers 133 and 143 and second metal layers 134 and 144. As shown, the normal gates 130 and 140 may be formed by stacking two or more layers of the first metal layers 133 and 143 and the second metal layers 134 and 144.

The first metal layers 133 and 143 may function to adjust a work function, and the second metal layers 134 and 144 may function to fill spaces formed by the first metal layers 133 and 143.

As shown in FIG. 3A, the first metal layers 133 and 143 are interposed between the gate insulation layers 132 and 142 and the second metal layers 134 and 144. For example, the first metal layers 133 and 143 cover conformally the gate insulating layers 132 and 142. In this case, the gate insulating layers 132 and 142 are U-shaped, and the first metal layers 133 and 143 are also U-shaped. The second metal layers 134 and 144 fill the insides of the U-shaped first metal layers 133 and 143.

In addition, the first metal layers 133 and 143 may cover conformally the field insulation layer 22 and the active fins F1 to F2. For example, as shown in FIG. 3B, the first metal layer 133 covers conformally a top surface of the field insulation layer 22 and sidewalls and top portions of the active fin F2. The second metal layer 143 may also cover conformally the field insulating layer 22 and the active fin F2.

The first metal layers 133 and 143 may be formed of, for example, at least one of TiN, TaN, TiC, TiAlC and TaC. The second metal layers 134 and 144 may be formed of, for example, W or Al, but the present inventive concept is not limited thereto. The first metal layers 133 and 143 and the second metal layers 134 and 144 may be formed in various configuration.

The normal gates 130 and 140 may be formed by, for example, a gate replacement process, but the present inventive concept is not limited thereto.

Alternatively, the normal gates 130 and 140 may be formed of a non-metal material including, for example, Si, or SiGe.

The gate insulation layers 132 and 142 may be formed under the normal gates 130 and 140.

The gate insulation layers 132 and 142 may be formed of a high-k dielectric material having a higher dielectric constant than silicon oxide. The gate insulation layers 132 and 142 may include, for example, $HfO_2$, $ZrO_2$, LaO, $Al2O3$ or $Ta2O5$, but the present inventive concept is not limited thereto.

As shown in FIG. 3A, the gate insulation layers 132 and 142 may be U-shaped. For example, the gate insulation layers 132 and 142 extend along the top surfaces of the active fins F1 to F5 and lateral surfaces of the normal gates 130 and 140.

In addition, the gate insulation layers 132 and 142 may extend in the second direction Y along the top surface of the field insulation layer 22 and lateral surfaces and top surfaces of the active fins F1 to F5. For example, as shown in FIG. 3, the gate insulation layer 132 extends in the second direction Y along the top surface of the field insulation layer 22, and lateral surfaces and top surfaces of the active fins F1 to F5.

The normal spacers 131 and 141 are formed at opposite sides of the normal gates 130 and 140, respectively. For example, the normal spacer 131 is formed at opposite sides of the normal gate 130, and the normal spacer 141 is formed at opposite sides of the normal gate 140.

The normal spacers 131 and 141 are pillar-shaped, but the present inventive concept is not limited thereto. For example, shapes of the normal spacers 131 and 141 may vary in various manners.

In this embodiment, the normal spacers 131 and 141 may be formed of, for example, a nitride layer, but the present inventive concept is not limited thereto. However, constituents of the normal spacers 131 and 141 may vary in various manners. For example, the normal spacers 131 and 141 may include, for example, at least one of an oxide layer and an oxynitride layer.

The dummy gates 110 and 120 are formed on the device isolation layer 20, extending in the second direction Y.

For example, the dummy gate 110 extends on the device isolation layer 20 in the second direction Y without overlapping the active fins F1 to F5. The dummy gate 120 extends on the device isolation layer 20 in the second direction Y, overlapping the active fins F1 to F5.

In this case, the dummy gate 110 is formed only on the device isolation layer 20, and the dummy gate 120 is formed on the device isolation layer 20 and the active fins F1 to F5.

As shown, the dummy gates 110 and 120 are spaced apart from each other in the first direction X. In addition, as shown in FIG. 3A, the dummy gate 120 is spaced apart from the normal gate 130 in the first direction X.

In FIG. 1, the dummy gates 110 and 120 extending in the second direction Y are illustrated, but the present inventive concept is not limited thereto. For example, the dummy gates 110 and 120 extend in acute angles or obtuse angles with respect to the first direction X along which the active fins F1 to F5 are extended.

In this embodiment, each of the dummy gates 110 and 120 may include a metal gate. The dummy gates 110 and 120 may include first metal layers 113 and 123 and second metal layers 114 and 124, respectively.

In this embodiment, the first metal layers 113 and 123 and the second metal layers 114 and 124 included in the dummy gates 110 and 120 are substantially the same as the first metal layers 133 and 143 and the second metal layers 134 and 144 included in the normal gates 130 and 140, which have been described above.

The gate insulation layers 112 and 122 are formed under the dummy gates 110 and 120. Here, the gate insulation layers 112 and 122 formed under the dummy gates 110 and 120 may be substantially the same as the gate insulation layers 132 and 142 formed under the normal gates 130 and 140, which have been described above.

The dummy spacers 111 and 121 are formed at opposite sides of the dummy gates 110 and 120. For example, the dummy spacer 111 is formed at opposite sides of the dummy gate 110, and the dummy spacer 121 is formed at opposite sides of the dummy gate 120.

The dummy spacers 111 and 121 may be substantially the same as the above-described normal spacers 131 and 141.

Impurity epitaxial layers 31 to 33 are formed on the active fins F1 to F5. For example, the impurity epitaxial layer 31 is formed between the dummy gate 120 and the normal gate 130; the impurity epitaxial layer 32 is formed between two adjacent normal gates 130 and 140; and the impurity epitaxial layer 33 is formed at the other side of the normal gate 140. For example, the impurity epitaxial layer 33 is formed in the right side of the normal gate 140, as shown in FIG. 3A).

The impurity epitaxial layers 31 to 33 may be formed in some etched regions of the active fins F1 to F5. Alternatively, the impurity epitaxial layers 31 to 33 may be formed on the active fins F1 to F5 through, for example, an epitaxial growth process.

In an exemplary embodiment, the impurity epitaxial layers 31 to 33 may be elevated source or drain regions. In this case, top surfaces of the impurity epitaxial layers 31 to 33 may be higher than top surfaces of the active fins F1 to F5.

The impurity epitaxial layers 31 to 33 may be formed of a semiconductor material including Si, for example. The present inventive concept is not limited thereto.

If the semiconductor device 1 is a P-type Metal Oxide Semiconductor (PMOS) transistor, the impurity epitaxial layers 31 to 33 may include a compressive stress material. For example, the compressive stress material may include a material, for example, SiGe, having a larger lattice constant than silicon (Si).

The compressive stress material may increase the mobility of carriers of a channel region by applying compressive stress to the active fins F1 to F5.

If the semiconductor device 1 is an N-type Metal Oxide Semiconductor (NMOS) transistor, the impurity epitaxial layers 31 to 33 may include the same material as the substrate 10 or a tensile stress material. For example, if the substrate 10 includes Si, the impurity epitaxial layers 31 to 33 may include Si or a material having a smaller lattice constant than Si (for example, SiC or SiP).

For example, the tensile stress material may increase the mobility of carriers of a channel region by applying tensile stress to the active fins F1 to F5.

An interlayer dielectric layer 77, shown in FIG. 2, may cover the dummy gates 110 and 120 and the normal gates 130 and 140.

In this embodiment, the dummy gate 120 is formed on both the device isolation layer 20 and the active fins F1 to F5. For example, a boundary between the active fin F2 and the device isolation layer 20 is underneath the dummy gate 120. Accordingly, the impurity epitaxial layer 31 formed to be adjacent to the dummy gate 120 may grow well without a defect, such as a facet.

For example, the dummy gate 120 may be formed by replacing a poly Si gate with a metal gate through a gate replacement process. After forming the dummy gate 120 including the poly Si gate, the impurity epitaxial layer 31 may be formed between the dummy gate 120 and the normal gate 130.

The dummy gate 120 and the dummy spacer 121 may include, for example, Si. In this case, since the dummy gate 120 and the dummy spacer 121 may have a crystal structure similar to that of the impurity epitaxial layer 31 including Si. Part of the impurity epitaxial layer 31 may grow from the dummy gate 120 and the dummy spacer 121, and in this case, the impurity epitaxial layer 31 may grow without forming a defect, such as a facet.

Without the dummy gate 120 overlapping the device isolation layer 20 and the active fins F1 to F5, the growth of the impurity epitaxial layer 31 including Si may be interfered by the device isolation layer 20 including an insulating layer during the growth of the impurity epitaxial layer 31. Such interference of the device isolation layer 20 with the impurity epitaxial layer 31 may cause to generate defects, such as facets, in the impurity epitaxial layer 31.

In an exemplary embodiment, the dummy gate 120 is formed on the boundary between the device isolation layer 20 and the active fins F1 to F5, and thus the dummy gate 120 may serve to prevent the interference between the device isolation layer and the active fins F1 to F5, and thus the impurity epitaxial layer 31 may be formed in a reliable manner. Accordingly, the product reliability of the semiconductor device may be increased.

Hereinafter, a semiconductor device according to an exemplary embodiment of the present inventive concept will be described with reference to FIG. 4.

Figure 4:
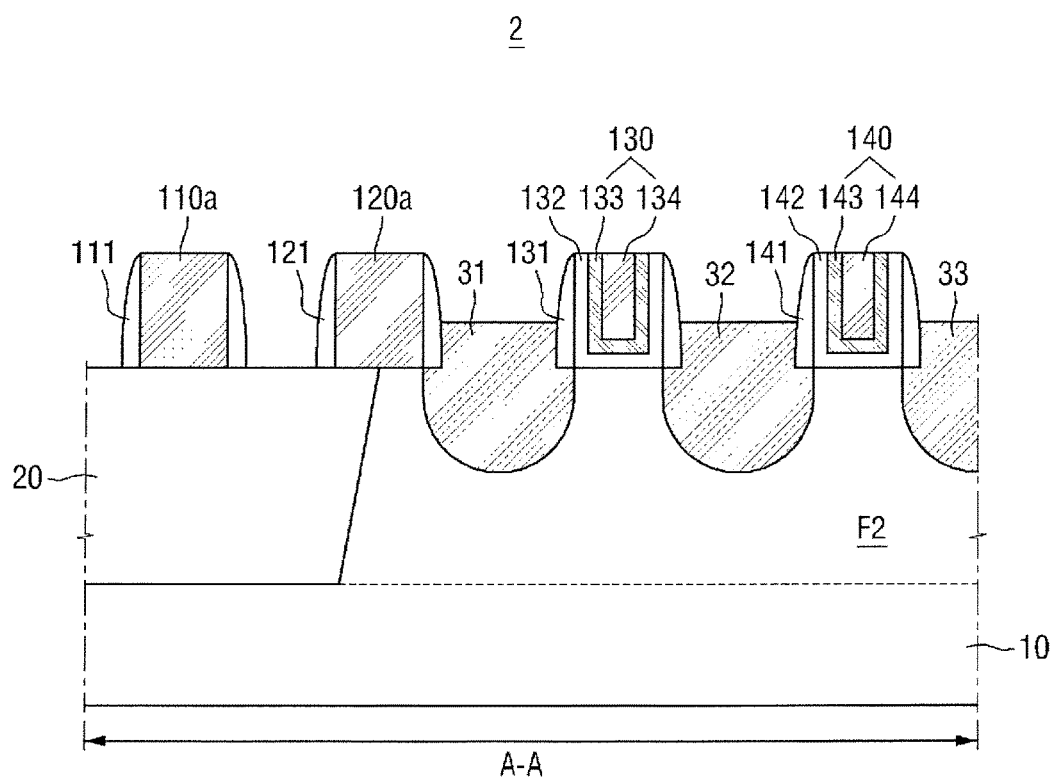
FIG. 4 is a cross-sectional view of a semiconductor device according to an exemplary embodiment of the present inventive concept.

FIG. 4 is a cross-sectional view of a semiconductor device according to an exemplary embodiment of the present inventive concept. For the sake of brevity and convenient explanation, substantially the same content with the previous embodiment will be omitted.

Referring to FIG. 4, the semiconductor device 2 is different from the semiconductor device 1, in view of configurations of dummy gates 110a and 120a.

For example, the dummy gates 110a and 120a of the semiconductor device 2 include poly Si gates, unlike in the semiconductor device 1 according to the previous embodiment.

The dummy gates 110a and 120a may be formed in such a manner that the poly Si gates included in the dummy gates 110a and 120a are not replaced with metal gates during a gate replacement process.

The dummy gate 110a including a poly Si gate and the dummy gate 120a including a poly Si gate are illustrated in FIG. 4, but the present inventive concept is not limited thereto.

For example, the dummy gate 110a may include a poly Si gate and the dummy gate 120a may include a metal gate. Alternatively, the dummy gate 110a may include a metal gate and the dummy gate 120a may include a poly Si gate.

Hereinafter, a semiconductor device according to an exemplary embodiment of the present inventive concept will be described with reference to FIGS. 5 and 6.

Figure 5:
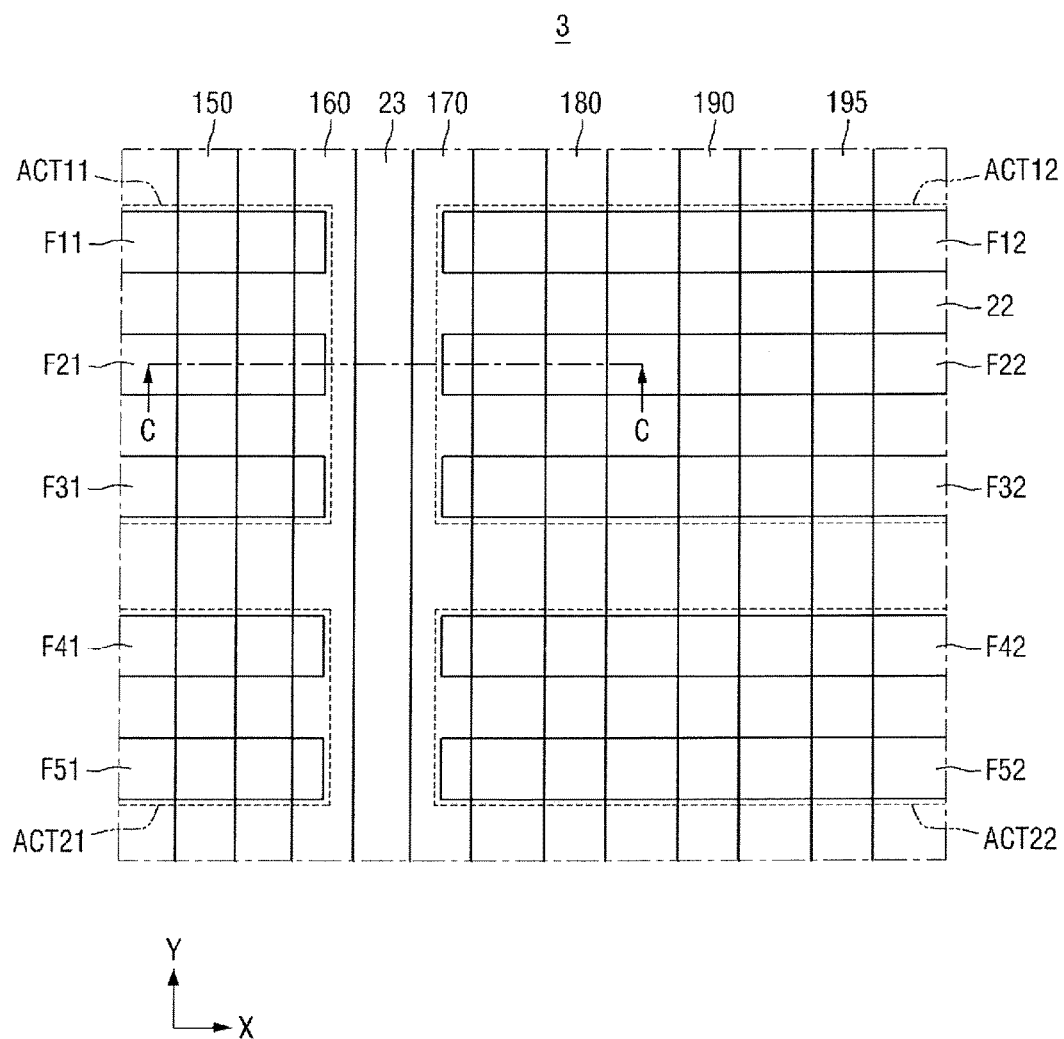
FIG. 5 is a layout view of a semiconductor device according to an exemplary embodiment of the present inventive concept.

FIG. 5 is a layout view of a semiconductor device according to an exemplary embodiment of the present inventive concept. FIG. 6 is a cross-sectional view taken along line C-C of FIG. 5. For the sake of brevity and convenient explanation, substantially the same content with the previous embodiment will be omitted.

Figure 6:
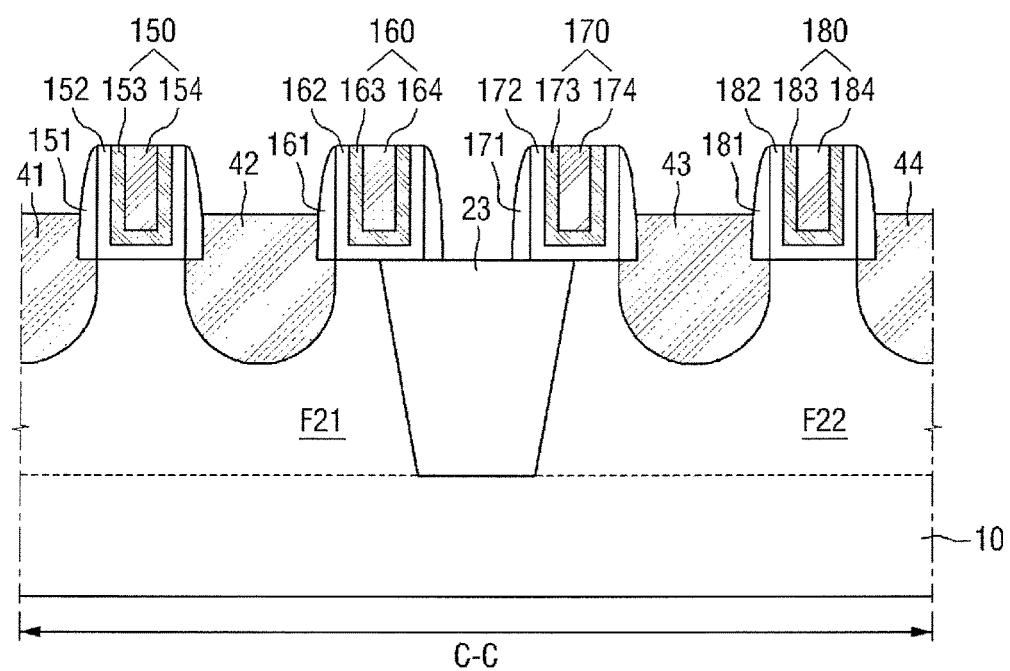
FIG. 6 is a cross-sectional view taken along line C-C of FIG. 5.

Referring to FIGS. 5 and 6, the semiconductor device 3 includes active fins F11, F21 and F31 in first active region ACT11, active fins F12, F22 and F32 in a second active region ACT12, active fins F41 and F5 in a third active region ACT21, and active fins F42 and F52 in a fourth active region ACT22.

The active fins F11, F21, and F31 are spaced apart from the active fins F12, F22, and F32 in a first direction X1, and the active fins F41 and F51 are spaced apart from the active fins F42 and F52 in the first direction X1.

A normal gate 150 is disposed on the active fins F11, F21, F31, F41, and F51, extending in the second direction Y and crossing the active fins F11, F21, F31, F41, and F51. Normal gates 180, 190, and 195 are disposed on the active fins F12, F22, F32, F42 and F52, extending in the second direction Y and crossing the active fins F12, F22, F32, F42 and F52.

A first dummy gate 160 overlaps the active fins F11, F21, F31, F41, and F51 and the device isolation layer 23, extending in the second direction Y.

A second dummy gate 170 overlaps the active fins F12, F22, F32, F42 and F52 and the device isolation layer 23, extending in the second direction Y.

The first metal layers 153 and 183 and the second metal layers 154 and 184 included in the normal gates 150 and 180 may be substantially the same as corresponding elements of the previous embodiment, which have been described above. In addition, the gate insulation layers 152 and 182 and the normal spacers 151 and 181 may also be substantially the same as corresponding elements of the previous embodiment, which have been described above.

The first metal layers 163 and 173 and the second metal layers 164 and 174 included in the dummy gates 160 and 170 may be substantially the same as corresponding elements of the previous embodiment, which have been described above. In addition, the gate insulation layers 162 and 172 and the dummy spacers 161 and 171 may also be substantially the same as corresponding elements of the previous embodiment, which have been described above.

Impurity epitaxial layers may be formed on the active fins disposed at opposite sides of the normal gate. For example, impurity epitaxial layers 41 and 42 are formed on an active fin F21 disposed at opposite sides of the normal gate 150, and impurity epitaxial layers 43 and 44 are formed on an active fin F22 disposed at opposite sides of the normal gate 180.

Since the dummy gate 160 is formed to be adjacent to the impurity epitaxial layer 42, the impurity epitaxial layer 42 may be formed in a reliable manner. In addition, since the dummy gate 170 is formed to be adjacent to the impurity epitaxial layer 43, the impurity epitaxial layer 43 may also be formed in a reliable manner.

Hereinafter, a semiconductor device according to an exemplary embodiment of the present inventive concept will be described with reference to FIG. 7.

Figure 7:
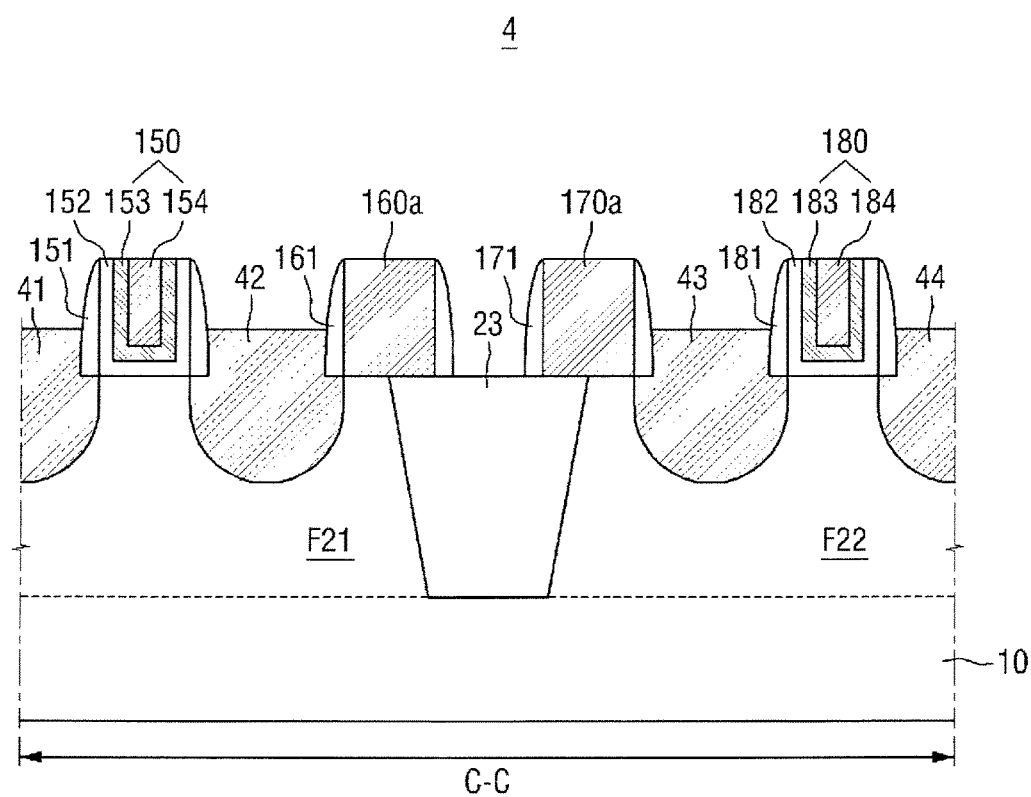
FIG. 7 is a cross-sectional view of a semiconductor device according to an exemplary embodiment of the present inventive concept.

FIG. 7 is a cross-sectional view of a semiconductor device according to an exemplary embodiment of the present inventive concept. For the sake of brevity and convenient explanation, substantially the same content with the previous embodiments will be omitted.

Referring to FIG. 7, the semiconductor device 4 is different from the semiconductor device 3 according to the previous embodiment shown in FIG. 5, in view of configurations of dummy gates 160a and 170a.

For example, the dummy gates 160a and 170a of the semiconductor device 4 include poly Si gates, unlike in the semiconductor device 3 according to the previous embodiment.

The dummy gates 160a and 170a may be formed in such a manner that the poly Si gates included in the dummy gates 160a and 170a are not replaced with metal gates during a gate replacement process.

The dummy gate 160a including a poly Si gate and the dummy gate 170a including a poly Si gate are illustrated in FIG. 7, but the present inventive concept is not limited thereto. For example, the dummy gate 160a may include a poly Si gate and the dummy gate 170a may include a metal gate. Alternatively, the dummy gate 160a may include a metal gate and the dummy gate 170a may include a poly Si gate.

Hereinafter, a semiconductor device according to an exemplary embodiment of the present inventive concept will be described with reference to FIGS. 8 and 9.

Figure 8:
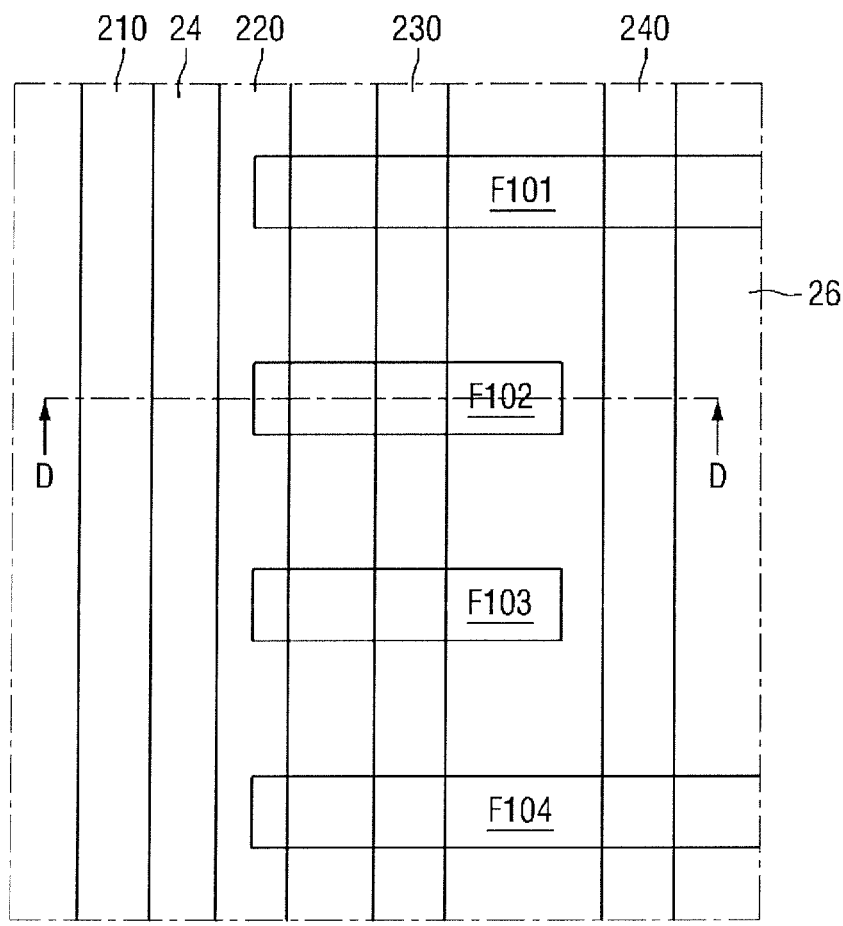
FIG. 8 is a layout view of a semiconductor device according to an exemplary embodiment of the present inventive concept.
Figure 9:
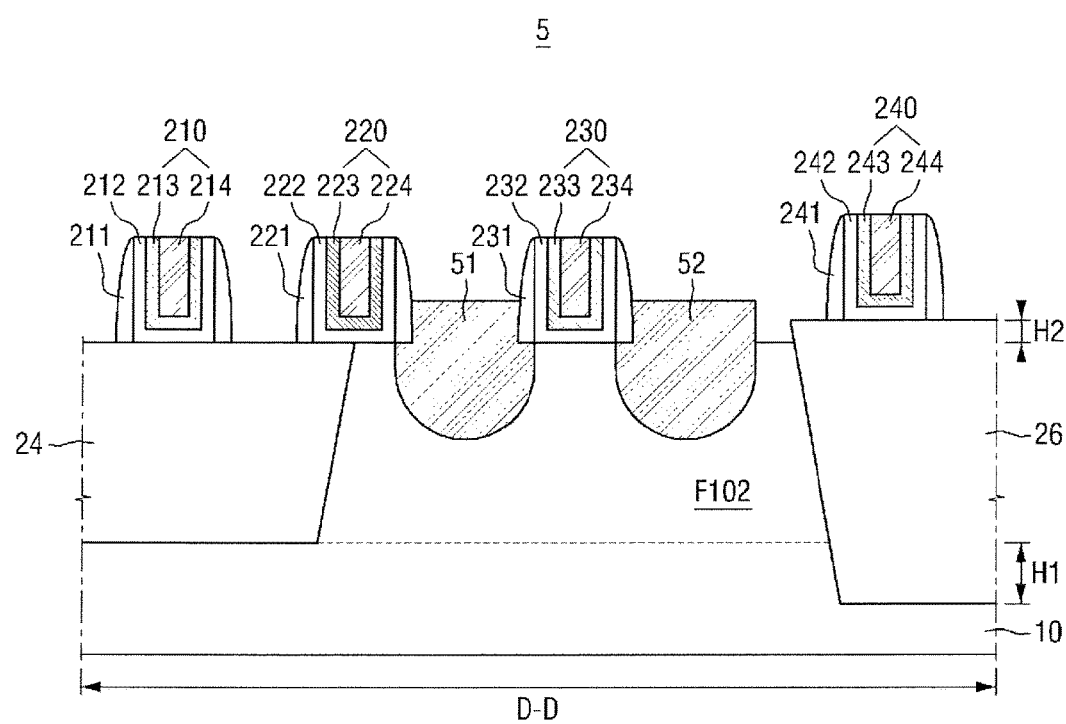
FIG. 9 is a cross-sectional view taken along line D-D of FIG. 8.

FIG. 8 is a layout view of a semiconductor device according to an exemplary embodiment of the present inventive concept, and FIG. 9 is a cross-sectional view taken along line D-D of FIG. 8. For the sake of brevity and convenient explanation, substantially the same content with the previous embodiments will be omitted.

Referring to FIGS. 8 and 9, active fins F101 to F104 of the semiconductor device 5 extend in a first direction X.

In this embodiment, long sides of the active fins F101 and F104 are longer than long sides of the active fins F102 and F103.

A first device isolation layer 24 is formed at one side of the active fins F101 to F104 (for example, in the left side of FIG. 8). A second device isolation layer 26 is formed at the other side of the active fins F102 and F103 (for example, in the right side of FIG. 8).

As shown, the second device isolation layer 26 may be formed at the other side of the active fins F102 and F103 (for example, in the right side of FIG. 8).

A bottom surface of the second device isolation layer 26 is lower than a bottom surface of the first device isolation layer 24. For example, the bottom surface of the second device isolation layer 26 is lower than the bottom surface of the first device isolation layer 24 by a first predetermined distance H1.

The bottom surface of the second device isolation layer 26 is also lower than a top surface of the substrate 10 (that is, a bottom surface of the active fin F102).

A top surface of the second device isolation layer 26 is higher than a top surface of the first device isolation layer 24. For example, the top surface of the second device isolation layer 26 is higher than the top surface of the first device isolation layer 24 by a predetermined distance H2.

Accordingly, a total height of the second device isolation layer 26 is greater than a total height of the first device isolation layer 24 by the sum of the first distance H1 and the second distance H2.

The dummy gate 210 is disposed on the first device isolation layer 24, extending in the second direction Y without overlapping the active fins F101 to F104. The dummy gate 220 is disposed on the first device isolation layer 24, extending in the second direction Y and overlapping the active fins F101 to F104.

The dummy gate 240 is disposed on the second device isolation layer 26, extending in the second direction Y. The dummy gate 240 does not overlap the active fins F102 and F103 and overlaps the active fins F101 and F104.

First metal layers 213, 223, and 243 and second metal layers 214, 224, and 244 included in the dummy gates 210, 220, and 240 may be substantially the same as corresponding elements of the previous embodiment, which have been described above. In addition, gate insulation layers 212, 222, and 242 and dummy spacers 211, 221, and 241 may also be substantially the same as corresponding elements of the previous embodiment, which have been described above.

A normal gate 230 is disposed on the active fins F101 to F104, extending in the second direction Y and crossing the active fins F101 to F104.

The first metal layer 233 and the second metal layer 234 included in the normal gate 230 may be substantially the same as corresponding elements of the previous embodiment, which have been described above. In addition, a gate insulation layer 232 and a normal spacer 231 may also be substantially the same as corresponding elements of the previous embodiment, which have been described above.

Impurity epitaxial layers may be formed on active fins disposed at opposite sides of the normal gate 230. For example, impurity epitaxial layers 51 and 52 are formed on active fin F102 disposed at opposite sides of the normal gate 230.

Since the dummy gate 220 is formed to be adjacent to the impurity epitaxial layer 51, the impurity epitaxial layer 51 may be formed in a reliable manner.

Hereinafter, a semiconductor device according to an exemplary embodiment of the present inventive concept will be described with reference to FIG. 10.

Figure 10:
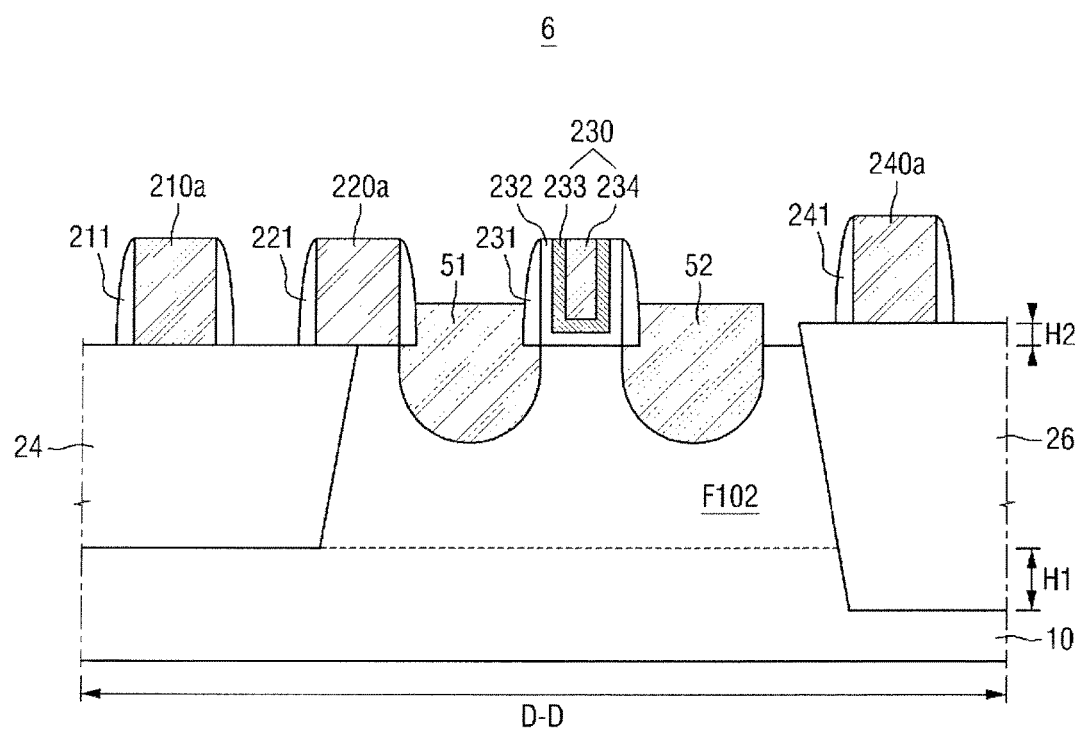
FIG. 10 is a cross-sectional view of a semiconductor device according to an exemplary embodiment of the present inventive concept.

FIG. 10 is a cross-sectional view of a semiconductor device according to an exemplary embodiment of the present inventive concept. For the sake of brevity and convenient explanation, substantially the same content with the previous embodiments will be omitted.

Referring to FIG. 10, the semiconductor device 6 is different from the semiconductor device 5 according to the previous embodiment shown in FIGS. 8 and 9, in view of configurations of dummy gates 210a, 220a, and 240a.

For example, the dummy gates 210a, 220a, and 240a of the semiconductor device 6 may include poly Si gates, unlike the semiconductor device 5 according to the previous embodiment.

The dummy gates 210a, 220a, and 240a may be formed in such a manner that the poly Si gates included in the dummy gates 210a, 220a, and 240a are not replaced with metal gates during a gate replacement process.

The dummy gates 210a, 220a, and 240a including poly Si gates are illustrated in FIG. 10, but the present inventive concept is not limited thereto. For example, one of the dummy gates 210a, 220a, and 240a may include a poly Si gate and the other two dummy gates may include metal gates.

Alternatively, two of the dummy gates 210a, 220a, and 240a may include poly Si gates and the other may include a metal gate.

Hereinafter, a semiconductor device according to an exemplary embodiment of the present inventive concept will be described with reference to FIGS. 11 and 12.

Figure 11:
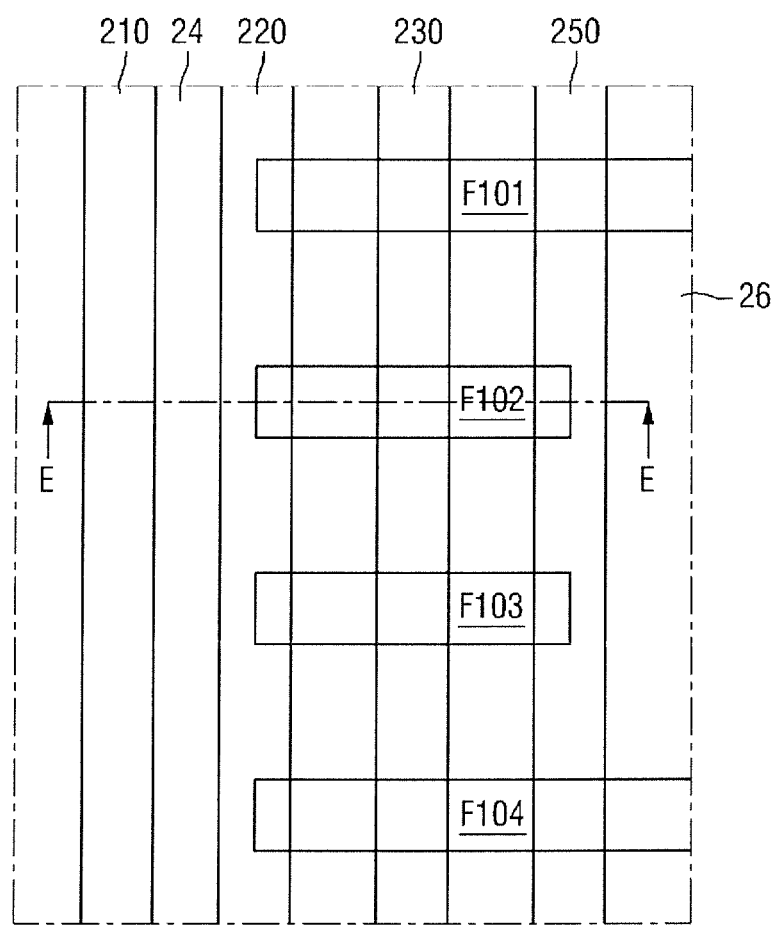
FIG. 11 is a layout view of a semiconductor device according to an exemplary embodiment of the present inventive concept.
Figure 12:
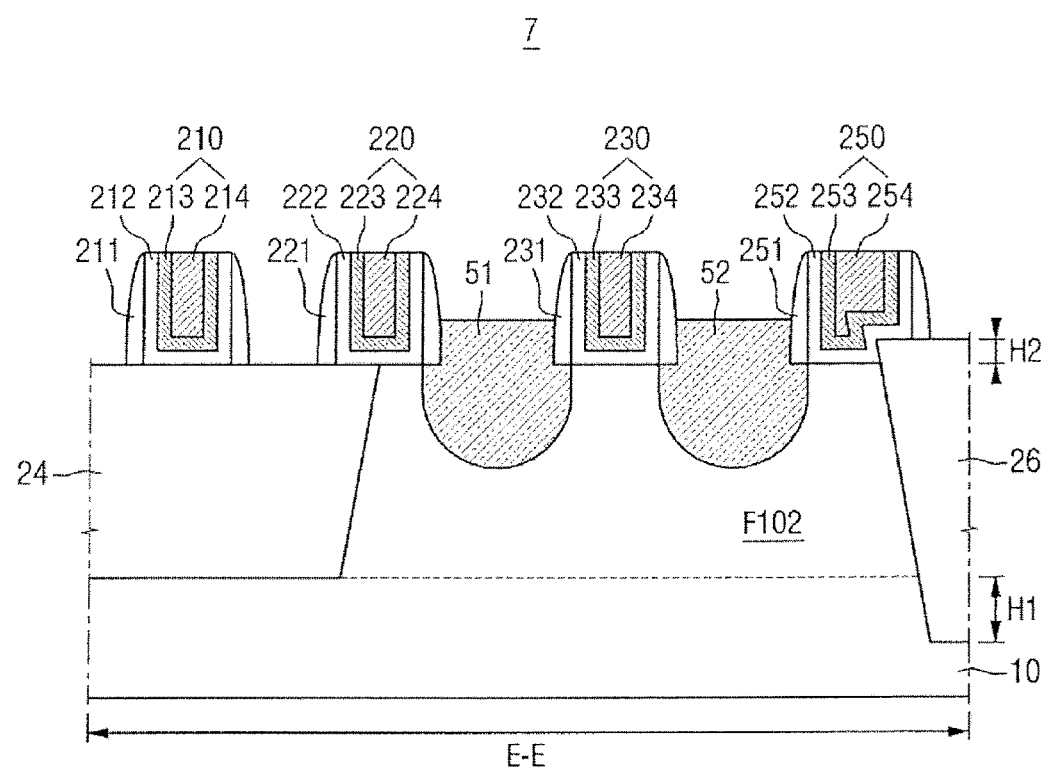
FIG. 12 is a cross-sectional view taken along line E-E of FIG. 11.

FIG. 11 is a layout view of a semiconductor device according to an exemplary embodiment of the present inventive concept, and FIG. 12 is a cross-sectional view taken along line E-E of FIG. 11. For the sake of brevity and convenient explanation, substantially the same content with the previous embodiments will be omitted.

Referring to FIGS. 11 and 12, the semiconductor device 7 is different from the semiconductor device 5 according to the previous embodiment shown in FIGS. 8 and 9, in view of arrangement of a dummy gate 250.

For example, unlike the semiconductor device 5 of FIGS. 8 and 9 in which the dummy gate 240 is disposed on the second device isolation layer 26, extending in the second direction Y without overlapping the active fins F102 and F103, the dummy gate 250 of the semiconductor device 7 is disposed on a second device isolation layer 26, extending in a second direction Y and overlapping some portions of active fins F102 and F103.

Accordingly, an impurity epitaxial layer 52 formed to be adjacent to the dummy gate 250 may be formed in a reliable manner.

Hereinafter, a semiconductor device according to an exemplary embodiment of the present inventive concept will be described with reference to FIG. 13.

Figure 13:
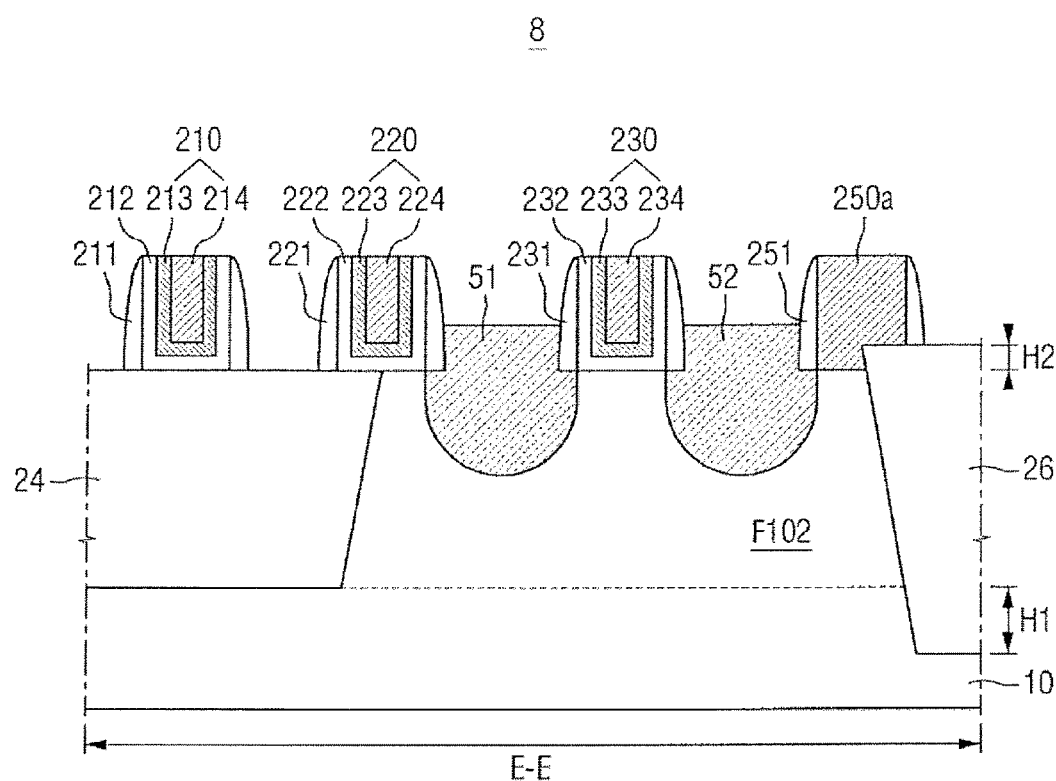
FIG. 13 is a cross-sectional view of a semiconductor device according to an exemplary embodiment of the present inventive concept.

FIG. 13 is a cross-sectional view illustrating a semiconductor device according to an exemplary embodiment of the present inventive concept. For the sake of brevity and convenient explanation, substantially the same content with the previous embodiments will be omitted.

Referring to FIG. 13, the semiconductor device 8 is different from the semiconductor device 7 according to the previous embodiment shown in FIG. 12, in view of configuration of a dummy gate 250a.

For example, the dummy gate 250a of the semiconductor device 8 may include a poly Si gate, unlike in the semiconductor device 7 according to the previous embodiment.

The dummy gate 250a may be formed in such a manner that the poly Si gate included in the dummy gate 250a is not replaced with a metal gate during a gate replacement process.

Among dummy gates 210 and 220 and 250a, only the dummy gate 250a includes a poly Si gate, but the present inventive concept is not limited thereto. For example, at least one of dummy gates 210 and 220 may include a poly Si gate.

Figure 14:
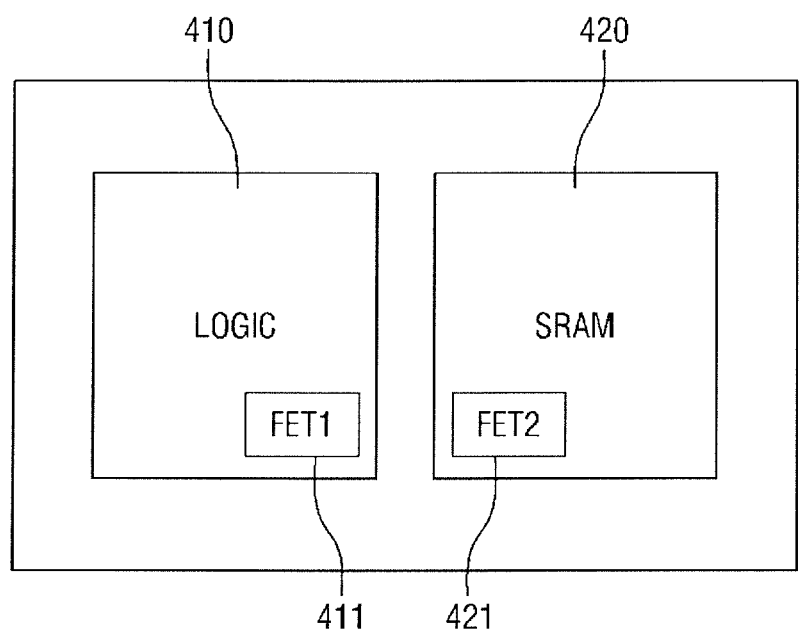
FIG. 14 and 15 are block diagrams of semiconductor devices according to an exemplary embodiment of the present inventive concept.
Figure 15:
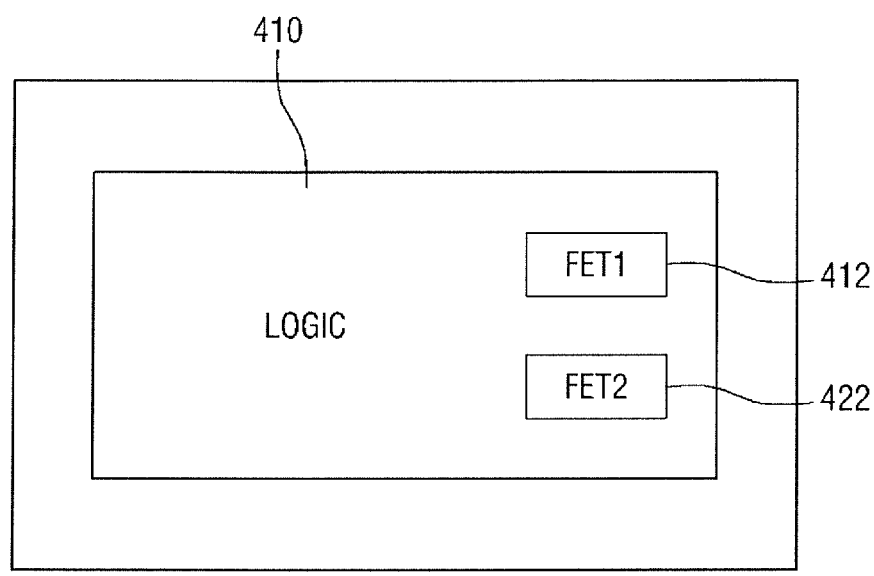

FIGS. 14 and 15 are block diagrams of semiconductor devices according to exemplary embodiments of the present inventive concept.

Referring first to FIG. 14, the semiconductor device 13 includes a logic region 410 and a static random access memory (SRAM) forming region 420. A first transistor 411 is disposed in the logic region 410, and a second transistor 421 is disposed in the SRAM forming region 420.

The first transistor 411 and the second transistor 421 may be different from each other. For example, the first transistor 411 may include the above-described semiconductor device 5 and the second transistor 421 may include the above-described semiconductor device 3. The present inventive concept is not limited thereto. Configurations of the first transistor 411 and the second transistor 421 may vary in various manners.

Next, referring to FIG. 15, the semiconductor device 14 may include a logic region 410, and third and fourth transistors 412 and 422, which are different from each other, are formed in the logic region 410. The third and fourth transistors 412 and 422 different from each other may be formed in an SRAM forming region 420 (not shown) as well.

The third transistor 412 and the fourth transistor 422 may be different from each other. For example, the third transistor 412 may be an N-type Metal Oxide Semiconductor (NMOS) transistor and the fourth transistor 422 may be a P-type Metal Oxide Semiconductor (PMOS) transistor, but the present inventive concept is not limited thereto.

The third and fourth transistors 412 and 422 may include at least one of the semiconductor devices 1 to 8 according to an exemplary embodiment of the present inventive concept.

In FIG. 14, the logic region 410 and the SRAM forming region 420 are illustrated by way of example, but the present inventive concept is not limited thereto. For example, the present inventive concept may also be applied to the logic region 410 and a region where other types of memories are formed. For example, the other memories may include a dynamic random access memory (DRAM), a magnetoresistive random access memory (MRAM), a resistive random access memory (RRAM), a phase change random access memory (PRAM), etc.

Figure 16:
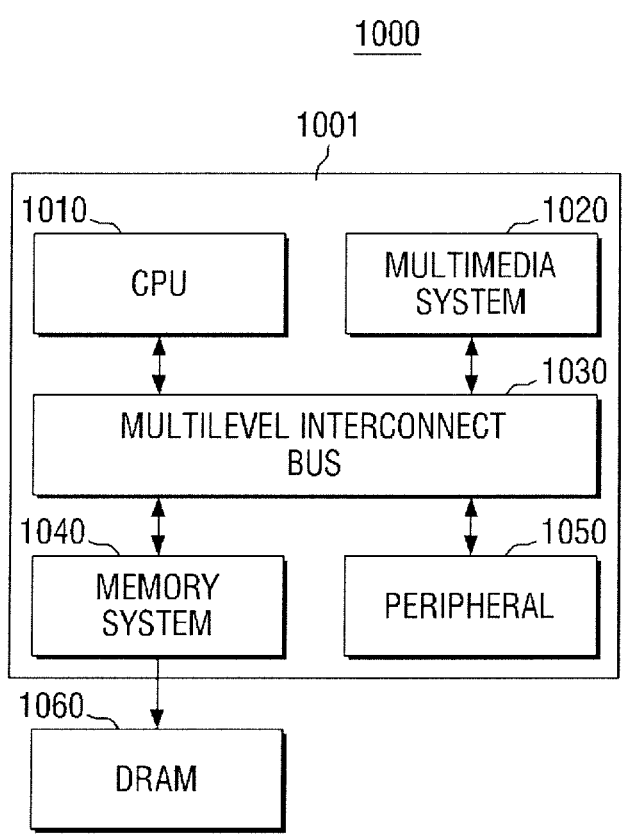
FIG. 16 is a block diagram of a system on chip (SoC) system including a semiconductor device according to an exemplary embodiment of the present inventive concept.

FIG. 16 is a block diagram of a system on chip (SoC) system including a semiconductor device according to an exemplary embodiment of the present inventive concept.

Referring to FIG. 16, the SoC system 1000 includes an application processor 1001 and a DRAM 1060.

The application processor 1001 includes a central processing unit (CPU) 1010, a multimedia system 1020, a bus 1030, a memory system 1040, and a peripheral circuit 1050.

The CPU 1010 may execute arithmetic operations required to drive the SoC system 1000. In some exemplary embodiments of the present inventive concept, the CPU 1010 may be configured by multi-core environments including a plurality of cores.

The multimedia system 1020 may be used when the SoC system 1000 performs various multimedia functions. The multimedia system 1020 may include a three dimensional (3D) engine module, a video codec, a display system, a camera system, and a post-processor.

The bus 1030 may be used when the CPU 1010, the multimedia system 1020, the memory system 1040, and the peripheral circuit 1050 perform data communication with each other. In some exemplary embodiments of the present inventive concept, the bus 1030 may have a multi-layer structure. For example, the bus 1030 may include a multi-layer advanced high-performance bus (AHB) or a multi-layer advanced eXtensible interface (AXI), but the present inventive concept is not limited thereto.

The memory system 1040 may provide an environment required for high-speed operation of the application processor 1001 connected to an external memory (for example, DRAM 1060). In some exemplary embodiments of the present inventive concept, the memory system 1040 may include a separate controller (for example, a DRAM controller) for controlling the external memory (for example, DRAM 1060).

The peripheral circuit 1050 may provide environments required for the SoC system 1000 to be connected to an external device (e.g., a main board). Accordingly, the peripheral circuit 1050 may include various interfaces to be compatible with the external device connected to the SoC system 1000.

The DRAM 1060 may function as a working memory required for the application processor 1001 to operate. In some exemplary embodiments of the present inventive concept, as shown, the DRAM 1060 may be positioned outside the application processor 1001. In this case, the DRAM 1060 may be packaged with the application processor 1001 in the form of a package on package (PoP). Alternatively, the DRAM 1060 may be part of the application processor 1001. In this case, the DRAM 1060 may be integrated with the application processor in a fabrication process thereof.

At least one of the components of the SoC system 1000 may employ one of the semiconductor devices 1 to 8 according to some exemplary embodiments of the present inventive concept.

Figure 17:
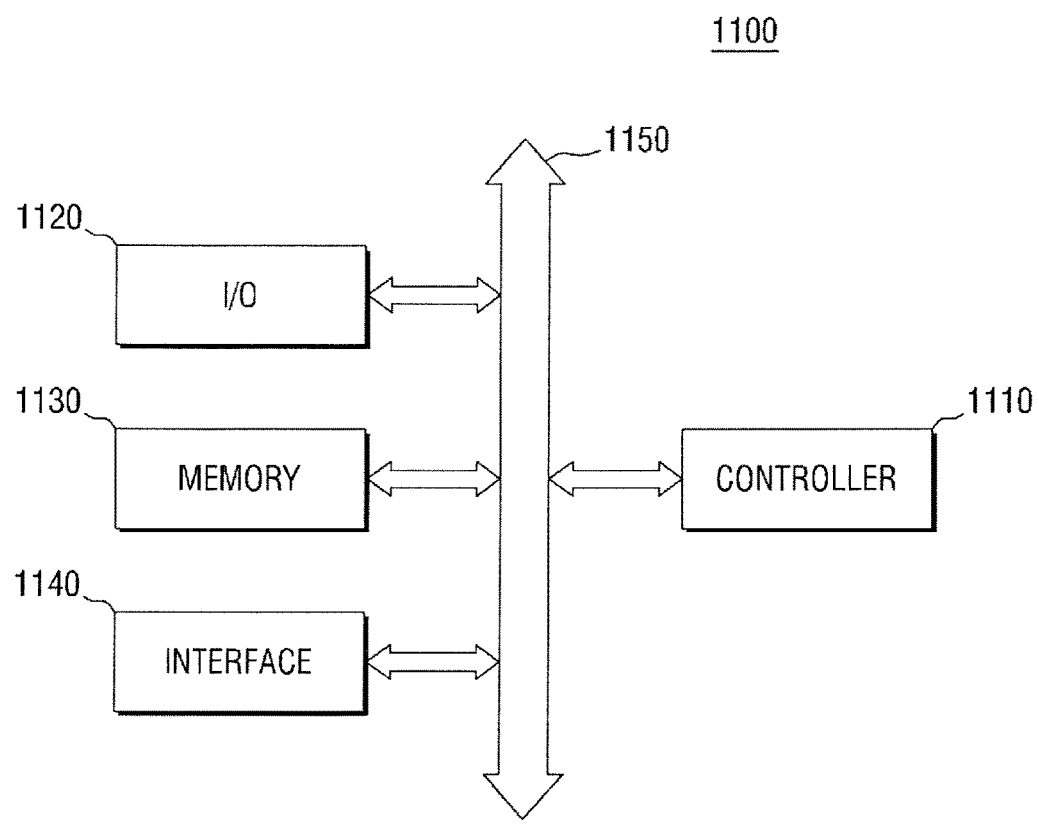
FIG. 17 is a block diagram of an electronic system including a semiconductor device according to an exemplary embodiment of the present inventive concept.

FIG. 17 is a block diagram of an electronic system including a semiconductor device according to an exemplary embodiment of the present inventive concept.

Referring to FIG. 17, the electronic system 1100 includes a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of performing similar functions of these elements listed. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as a working memory for increasing the performance of the controller 1110.

The semiconductor devices 1 to 8 according to some exemplary embodiments of the present inventive concept may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 18:
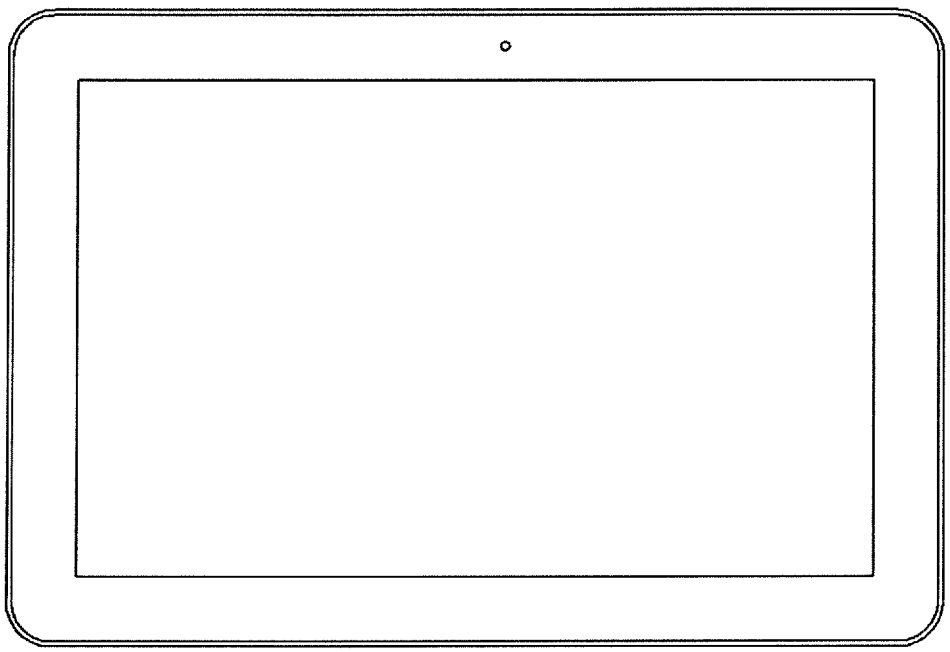
FIGS. 18 to 20 illustrate exemplary semiconductor systems including a semiconductor device according to an exemplary embodiment of the present inventive concept.
Figure 19:
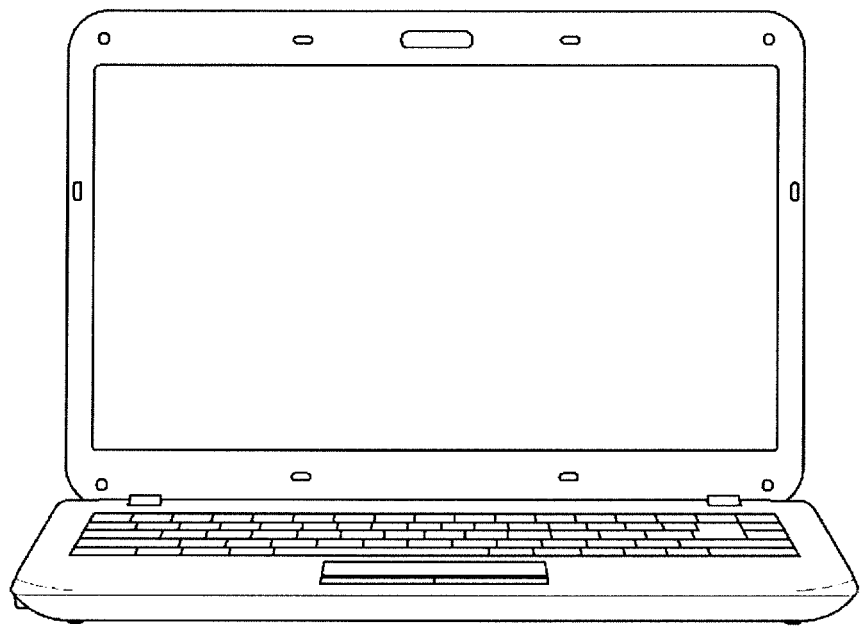
Figure 20:
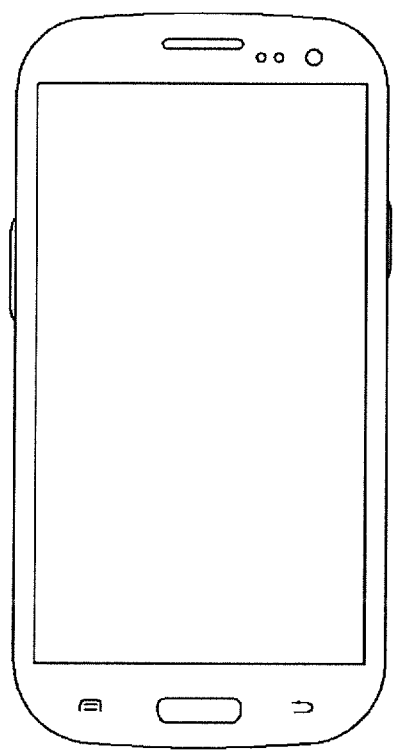

FIGS. 18 to 20 illustrate exemplary electronic systems to which semiconductor devices according to some exemplary embodiments of the present inventive concept may be applied.

FIG. 18 illustrates a tablet PC including a semiconductor device according to an exemplary embodiment of the present inventive concept, FIG. 19 illustrates a notebook computer including a semiconductor device according to an exemplary embodiment of the present inventive concept, and FIG. 20 illustrates a smart phone including a semiconductor device according to an exemplary embodiment of the present inventive concept. In addition, an exemplary semiconductor device according to the present inventive concept may also be applied to other consumer electronic products not illustrated herein.

For example, the consumer electronic products may include a computer, an ultra mobile personal computer (UMPC), a work station, a net-book, a personal digital assistant (PDA), a portable computer, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

FIGS. 21 to 26 are diagrams illustrating intermediate process steps in a method of fabricating a semiconductor device according to an exemplary embodiment of the present inventive concept.

Figure 21:
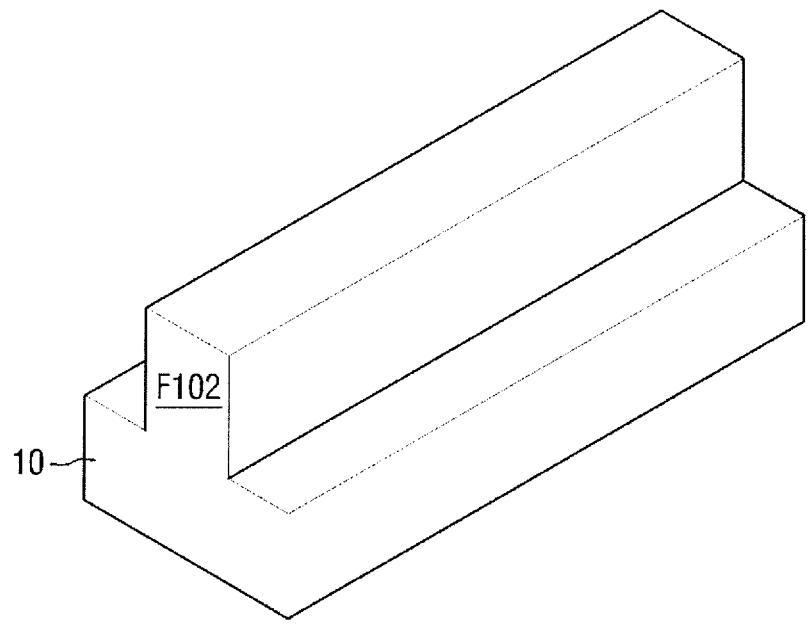
FIGS. 21 to 26 show process steps in a method of fabricating a semiconductor device according to an exemplary embodiment of the present inventive concept.

First, referring to FIG. 21, an active fin F102, which protrudes from a substrate 10 and extends in one direction, is formed on the substrate 10.

For example, the active fin F102 may be formed by etching the substrate 10. Alternatively, the active fin F102 may be formed by forming an epitaxial layer including a semiconductor material on the substrate 10 and patterning the formed epitaxial layer.

Figure 22:
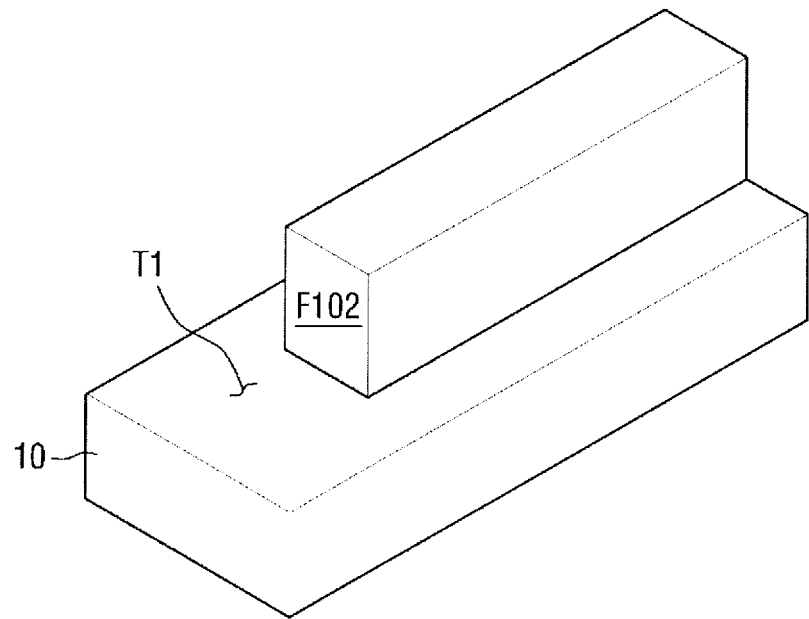

Next, referring to FIG. 22, a first trench T1 is formed by etching one side of the active fin F102 (for example, the left side of the active fin F102). A top surface of the substrate 10 may be exposed by the first trench T1.

Figure 23:
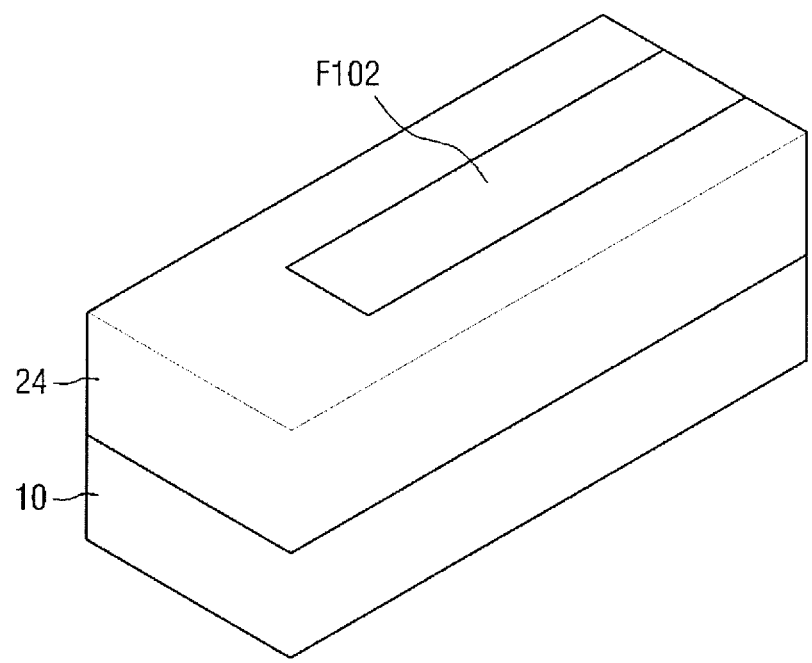

Next, referring to FIG. 23, a first device isolation layer 24 is formed to fill the first trench (T1 of FIG. 22) and to surround the active fin F102. The first device isolation layer 24 may extend in the second direction Y, for example, as shown in FIG. 8.

Figure 24:
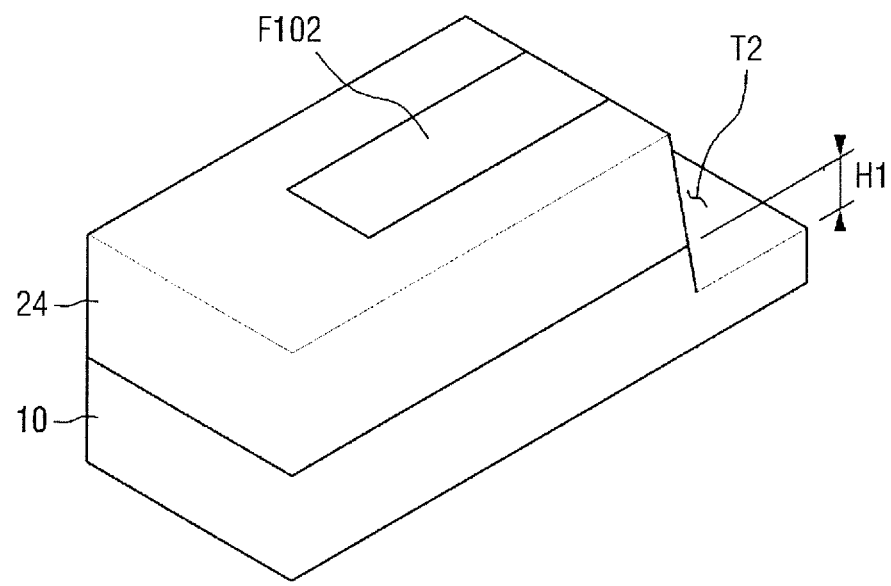

Referring to FIG. 24, a second trench T2 is formed by etching the other side of the active fin F102 (for example, the right side of the active fin F102). The second trench T2 is formed to be lower than the first trench (T1 of FIG. 22) by a first distance H1. For example, in the course of forming the second trench T2, a top portion of the substrate 10 may be etched.

Figure 25:
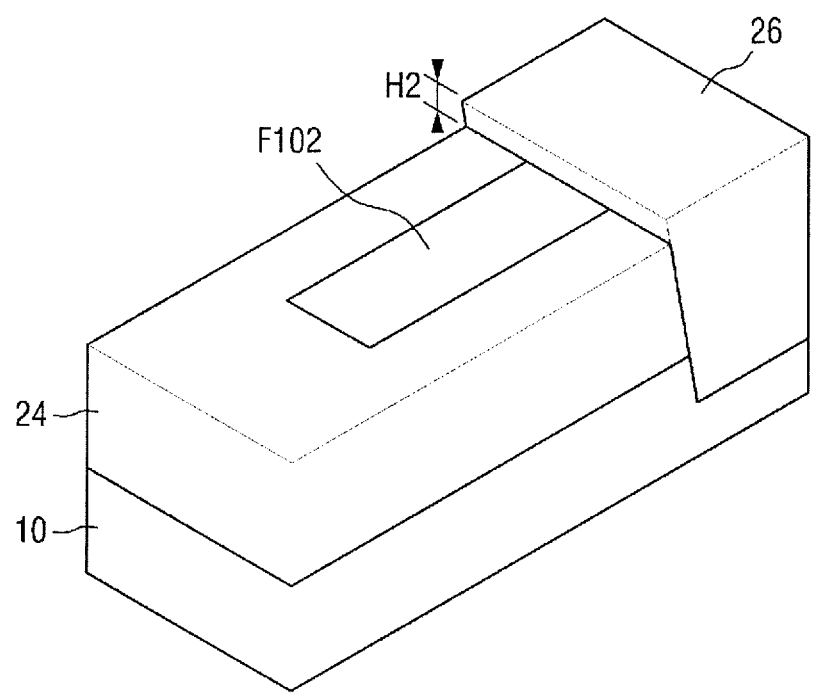

Next, referring to FIG. 25, the second trench (T2 of FIG. 24) is filled with a second device isolation layer 26. For example, the second device isolation layer 26 is formed to be higher than a top surface of the active fin F102 by a second distance H2. Accordingly, a top surface of the second device isolation layer 26 is higher than a top surface of the first device isolation layer 24 and a top surface of the active fin F102 by the second distance H2.

Figure 26:
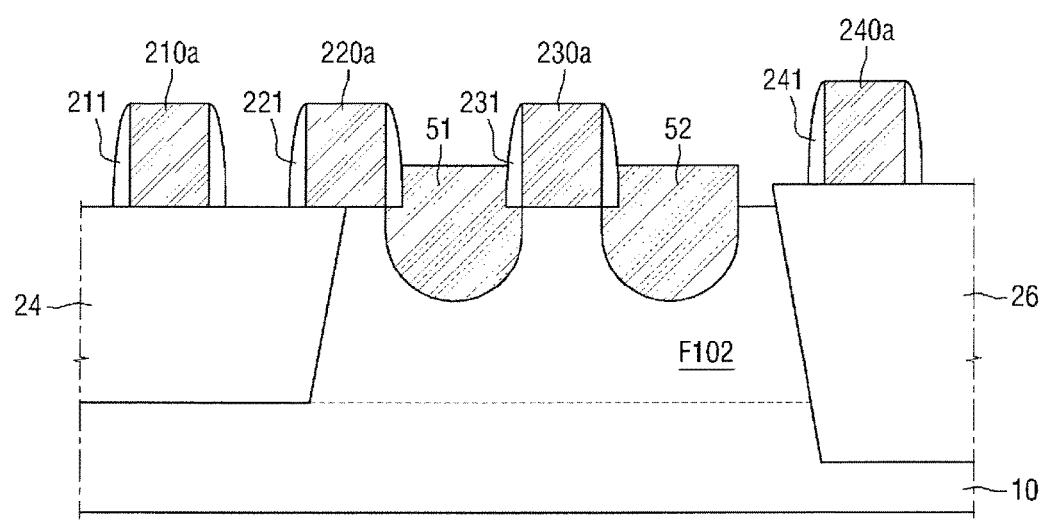

Next, referring to FIG. 26, dummy gates 210a, 220a, 230a, and 240a are formed on the active fin F102 and the first and second device isolation layers 24 and 26.

For example, the dummy gate 210a is formed on the first device isolation layer 24, extending in the second direction (Y of FIG. 8) without overlapping the active fin F102. The dummy gate 220a is formed on the active fin F102 and the first device isolation layer 24, extending in the second direction (Y of FIG. 8).

In addition, the dummy gate 230a may be formed on the active fin F102, extending in the second direction (Y of FIG. 8), and the dummy gate 240a may be formed on the second device isolation layer 26, extending in the second direction (Y of FIG. 8).

Next, spacers 211, 221, 231, and 241 are formed at opposite sides of the dummy gates 210a, 220a, 230a, and 240a, respectively. The spacers 211, 221, 231, and 241 may include materials having etching selectivity with respect to the dummy gates 210a, 220a, 230a, and 240a.

Next, impurity epitaxial layers 51 and 52 are formed on the active fin F102 disposed at opposite sides of the dummy gate 230a. In this embodiment, the impurity epitaxial layers 51 and 52 may be formed through, for example, an epitaxial growth process.

In such a manner, in a case where the impurity epitaxial layers 51 and 52 are formed through the epitaxial growth process, growth of the impurity epitaxial layers 51 and 52 may be interfered by an insulation layer formed to be adjacent to the impurity epitaxial layers 51 and 52. For example, the impurity epitaxial layers 51 and 52 may include a defect, such as a facet, due to the interference of the insulation layer.

In this embodiment, the dummy gate 220a and the spacer 221, including a material having a similar crystal structure to a material included in the impurity epitaxial layer 51, are formed to be adjacent to the impurity epitaxial layer 51. Therefore, the impurity epitaxial layer 51 may grow without or reducing defects through the epitaxial growth process.

Thereafter, the dummy gates 210a, 220a, 230a, and 240a are replaced with metal gates using a gate replacement process, thereby fabricating the semiconductor device 5 shown in FIG. 9.

In addition, the semiconductor device 6 shown in FIG. 10 may be fabricated by replacing only the dummy gate 230a among the dummy gates 210a, 220a, 230a, and 240a with a metal gate using the gate replacement process.

Further, the semiconductor device 7 of FIG. 12 and the semiconductor device 8 of FIG. 13 may be fabricated by forming the dummy gate 240a on the second device isolation layer 26 and the active fin F102, respectively.

In addition, the semiconductor device 1 of FIG. 2, the semiconductor device 2 of FIG. 4, the semiconductor device 3 of FIG. 6, and the semiconductor device 4 of FIG. 7 may be fabricated by skipping the process of forming the second device isolation layer 26.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. A semiconductor device comprising:
a plurality of active fins protruding from a substrate and extending in a first direction;
a first device isolation layer disposed at a first side of the active fins;
a second device isolation layer disposed at a second side of the active fins, wherein the second side is opposite to the first side;
a normal gate extending across the active fins in a second direction crossing the first direction;
a first dummy gate extending across the active fins and the first device isolation layer in the second direction;
a second dummy gate extending across the second device isolation layer in the second direction,
wherein the second dummy gate is disposed within a boundary of the second device isolation layer and the second dummy gate is spaced apart from the second side of the active fins, and
wherein a top surface of the second device isolation layer is higher than a top surface of the first device isolation layer and top surfaces of the active fins; and
a third dummy gate extending across the first device isolation layer in the second direction, wherein the third dummy gate is disposed within a boundary of the first device isolation layer and the third dummy gate is spaced apart from the first side of the active fins.

2. The semiconductor device of claim 1, wherein a bottom surface of the second device isolation layer is lower than a bottom surface of the first device isolation layer.

3. The semiconductor device of claim 1, wherein the normal gate includes a metal gate and at least one of the first dummy gate and the second dummy gate includes a poly Si gate.

4. The semiconductor device of claim 1, wherein the top surface of the first device isolation layer is positioned on substantially the same plane with the top surfaces of the plurality of active fins.

5. The semiconductor device of claim 1, further comprising:
an impurity epitaxial layer disposed on the active fins and between the first dummy gate and the normal gate adjacent to the first dummy gate,
wherein an upper surface of the impurity epitaxial layer is higher than the upper surface of the second device isolation layer.

6. The semiconductor device of claim 1, wherein upper surfaces of the active fins and the first device isolation layer on which the first dummy gate is formed are lower than an upper surface of the second device isolation layer on which the second dummy gate are formed.

7. The semiconductor device of claim 1, wherein a first portion of the first dummy gate is in direct contact with an impurity epitaxial layer formed in at least one of the plurality of active fins, wherein a second portion of the first dummy gate is in direct contact with the at least one of the plurality of active fins, and wherein a third portion of the first dummy gate is in direct contact with the first device isolation layer.

8. The semiconductor device of claim, wherein the normal gate includes a metal gate, and
wherein the third dummy gate include a poly Si gate.

9. A semiconductor device comprising:
a plurality of active fins protruding from a substrate and extending in a first direction;
a first device isolation layer disposed at a first side of the active fins;
a second device isolation layer disposed at a second side of the active fins, the second side is opposite to the first side;
a normal gate extending across the active fins in a second direction crossing the first direction;
a first dummy gate extending across the active fins and the first device isolation layer in the second direction;
a second dummy gate extending across the second device isolation layer in the second direction,
wherein the second dummy gate is disposed within a boundary of the second device isolation layer and the second dummy gate is spaced apart from the second side of the active fins,
wherein a top surface of the second device isolation layer is higher than a top surface of the first device isolation layer; and
wherein a bottom surface of the second device isolation layer is lower than a bottom surface of the first device isolation layer; and
a third dummy gate extending across the first device isolation layer in the second direction,
wherein the third dummy gate is disposed within a boundary of the first device isolation layer and the third dummy gate is spaced apart from the first side of the active fins.

10. The semiconductor device of claim 9, further comprising:
an impurity epitaxial layer disposed on the active fins and between the first dummy gate and the normal gate adjacent to the first dummy gate,
wherein a top surface of the impurity epitaxial layer is higher than the top surface of the second device isolation layer.

11. The semiconductor device of claim 9, wherein the top surface of the first device isolation layer is positioned on substantially the same plane with the top surfaces of the plurality of active fins.

12. The semiconductor device of claim 9, wherein the third dummy gate include a poly Si gate.

13. The semiconductor device of claim 9, wherein the normal gate includes a metal gate and at least one of the first dummy gate and the second dummy gate includes a poly Si gate.

14. The semiconductor device of claim 9, wherein a first portion of the first dummy gate is in direct contact with an impurity epitaxial layer formed in at least one of the plurality of active fins, wherein a second portion of the first dummy gate is in direct contact with the at least one of the plurality of active fins, and wherein a third portion of the first dummy gate is in direct contact with the first device isolation layer.

* * * * *